United States Patent [19]

Bachmann et al.

[11] 4,039,357

[45] Aug. 2, 1977

[54] ETCHING OF III-V SEMICONDUCTOR MATERIALS WITH $H_2S$ IN THE PREPARATION OF HETERODIODES TO FACILITATE THE DEPOSITION OF CADMIUM SULFIDE

[75] Inventors: Klaus Jürgen Bachmann, Piscataway; Manfred Hermann Bettini, Red Bank; Ernest Buehler, Chatham; Joseph Leo Shay, Marlboro; Sigurd Wagner, Holmdel, all of N.J.

[73] Assignee: Bell Telephone Laboratories, Incorporated, Murray Hill, N.J.

[21] Appl. No.: 718,386

[22] Filed: Aug. 27, 1976

[51] Int. Cl.$^2$ .................. H01L 21/205; H01L 21/302; H01L 31/06
[52] U.S. Cl. ..................................... 148/175; 29/572; 136/89 TF; 136/89 CD; 148/174; 156/612; 156/646; 357/16; 357/30; 357/61; 427/85; 427/87
[58] Field of Search ................ 148/174, 175; 156/612, 156/646; 136/89 CD, 89 TF; 29/572; 357/16, 30, 61; 427/85, 87

[56] References Cited

U.S. PATENT DOCUMENTS

| | | | |
|---|---|---|---|
| 3,312,571 | 4/1967 | Ruehrwein | 148/175 |
| 3,392,069 | 7/1968 | Merkel et al. | 156/646 |
| 3,393,103 | 7/1968 | Hellbardt et al. | 148/175 |
| 3,679,502 | 7/1972 | Hays | 156/646 |
| 3,697,338 | 10/1972 | Asai et al. | 148/175 X |
| 3,988,172 | 10/1976 | Bachmann et al. | 136/89 TF |

OTHER PUBLICATIONS

Yoshikawa et al., "Growth and Properties of CdS-Technique", J. Apol. Phys., vol. 45, No. 8, Aug. 1974, pp. 3523-3529.
Yoshikawa et al., "Optical Properties of Hetero-Epitaxial CdS Films", Japanese Journal of Applied Physics, vol. 13, No. 9, Sept. 1974, pp. 1353-1361.
Ito et al., "Photovoltaic Effect at n CdS-p InP Heterojunctions".
Ibid., vol. 14, No. 8, 1975, pp. 1259-1260.
Chu et al., "Etching of Germanium with-Hydrogen Sulfide", J. Electrochem. Soc., vol. 116, No. 9, Sept. 1969, pp. 1261-1263.

Primary Examiner—L. Dewayne Rutledge
Assistant Examiner—W. G. Saba
Attorney, Agent, or Firm—George S. Indig

[57] ABSTRACT

A hydrogen transport process for cleaning the surface of an indium or gallium based semiconductor material and for depositing n-type cadmium sulfide on the cleaned semiconductor material is disclosed. The cleaning and deposition can be accomplished in sequence or simultaneously. The process entails adding hydrogen sulfide to a hydrogen gas flow in a chemical vapor deposition process. Single crystalline photovoltaic cells of p-InP/n-CdS with a 13.5% efficiency have been reproducibly fabricated. An efficiency of 4.6% has been obtained with a thin layer polycrystalline p-InP/n-CdS cell. Additionally, a p-GaAs/n-CdS heterodiode cell has been produced.

10 Claims, 4 Drawing Figures

ETCHING OF III-V SEMICONDUCTOR MATERIALS WITH H₂S IN THE PREPARATION OF HETERODIODES TO FACILITATE THE DEPOSITION OF CADMIUM SULFIDE

BACKGROUND OF THE INVENTION

1. Field of the Invention

This invention relates to photovoltaic devices and is particularly relevant to the area of solar cells.

2. Art Background

Various methods including chemical vapor deposition (CVD) techniques have been used to make p III-V/n II-VI, heterodiodes by depositing a II-VI semiconductor on a III-V semiconductor substrate. For example, Ito and Oshawa have reported fabricating an n-CdS/p InP single crystal device by using a hydrogen-cadmium sulfide vapor growth technique. (See *Jap. J. Appl. Phys.*, 14 (8), 1259 (1975).) Mack et al. have used a hydrogen-hydrogen chloride growth technique to etch a GaAs substrate and to deposit a ZnSe layer. (See *Phys. Stat. Sol.*, 2, 701 (1970).)

The efficiency of a particular type heterodiode or even the ability to fabricate a heterodiode device depends on which of the various techniques is chosen to make the device. The p InP/n CdS cell is an apt illustration. Efficiencies up to 14% have been reported for single crystal p-InP/n-CdS devices made by depositing CdS on an InP substrate through molecular beam epitaxy followed by an annealing step. (See co-pending U.S. application of Bachmann et. al., Ser. No. 587,042, filed June 16, 1975 now U.S. Pat. No. 3,988,172, (Canadian application Ser. No. 244,052 filed Jan. 22, 1976); see also co-pending U.S. application of Bachmann et al. Ser. No. 672,878, filed Apr. 2, 1976 both of which are hereby incorporated by reference.) Yet, single crystal devices made by a CVD hydrogen transport technique have been reported to have only a 4% efficiency, (see Ito and Oshawa, *Jap. J. Appl. Phys.*, 14 (8), 1259 (1975). This demonstrates the desirability of a method involving a minimum number of steps which yields consistently high efficiencies (on the order of 13%). Particularly desirable is a CVD process with these attributes because of the adaptability of CVD techniques to large scale production.

While in the InP/CdS system efficiencies vary with the process employed, fabrication of some other prospective n-CdS/p-III-V heterodiode systems with useful efficiencies to date have not been reported. For example, an n-GaAs/n-CdS has been made by a close spaced chemical vapor deposition technique. (See *Jap. J. Appl. Phys.* 14 (16), 1547 (1975).) However, in the same article a p-GaAs/n-CdS device was shown to have very poor diode characteristics. Thus, it would also be advantageous to have a process which allows fabrication of such a device with diode properties.

SUMMARY OF THE INVENTION

A CVD hydrogen transport method can be modified to consistently produce single crystal p-InP/n-CdS cells exhibiting efficiencies of up to 13.5%, to produce a polycrystalline p-InP/n-CdS device with about a 4.6% efficiency, and to yield a p-GaAs/n-CdS device with an efficiency of about 5%. The modification involves adding a small fraction of hydrogen sulfide to the hydrogen gas flow used to transport the CdS. A contemplated theory explaining the phenomenon is that the H₂S in a reducing atmosphere such as a hydrogen environment forms sublimable compounds such as Ga₂S and In₂S with respectively gallium semiconductor materials such as GaAs and indium semiconductor material such as InP. The volatile compounds formed then sublime. The sublimation causes an etching of the surface which results in a substantially clean surface area. If CdS is then deposited an uncontaminated heterojunction is produced.

The CdS deposition process can occur simultaneously with the etching procedure. As the etching proceeds, nucleation is favored to occur on the cleaned portions of the substrate. The cleaning and nucleation continues until the entire substrate is coated. Once a CdS layer is formed the substrate semiconductor surface is sealed from further reactions with the vapor phase and recontamination of the heterojunction interface is thus avoided. The resulting clean interfaces lead to devices with excellent electrical characteristics within the limits set by the inherent properties of the semiconductors and crystal structure used.

In the preferred embodiment of the invention a hydrogen flow containing a small portion of H₂S is passed over a heated substrate of an indium or gallium semiconductor material such as p-InP or p-GaAs etching the surface of the substrate material. Cadmium sulfide is introduced into the gas flow upstream from the substrate. In the case of In semiconductor materials the cadmium sulfide can either be added upon initiation of the gas flow or after the gas flow and the resulting etching process has proceeded for a period of time. For gallium semiconductor material the CdS is added to the gas stream after etching has proceeded for a period of time. The simplest method of introducing the CdS is to heat bulk CdS in a boat placed upstream from the substrate. However, the means used for introducing the cadmium sulfide is not critical.

Single crystal p-InP/n-CdS devices have been made by the practice of this invention which consistently have efficiencies of up to 13.5%. An efficiency of about 4.6% has been obtained with a thin layer polycrystalline p-Inp/n-CdS device. Additionally, a p-GaAs/n-CdS device has been fabricated with an efficiency of about 5%.

DETAILED DESCRIPTION

Figure 1:
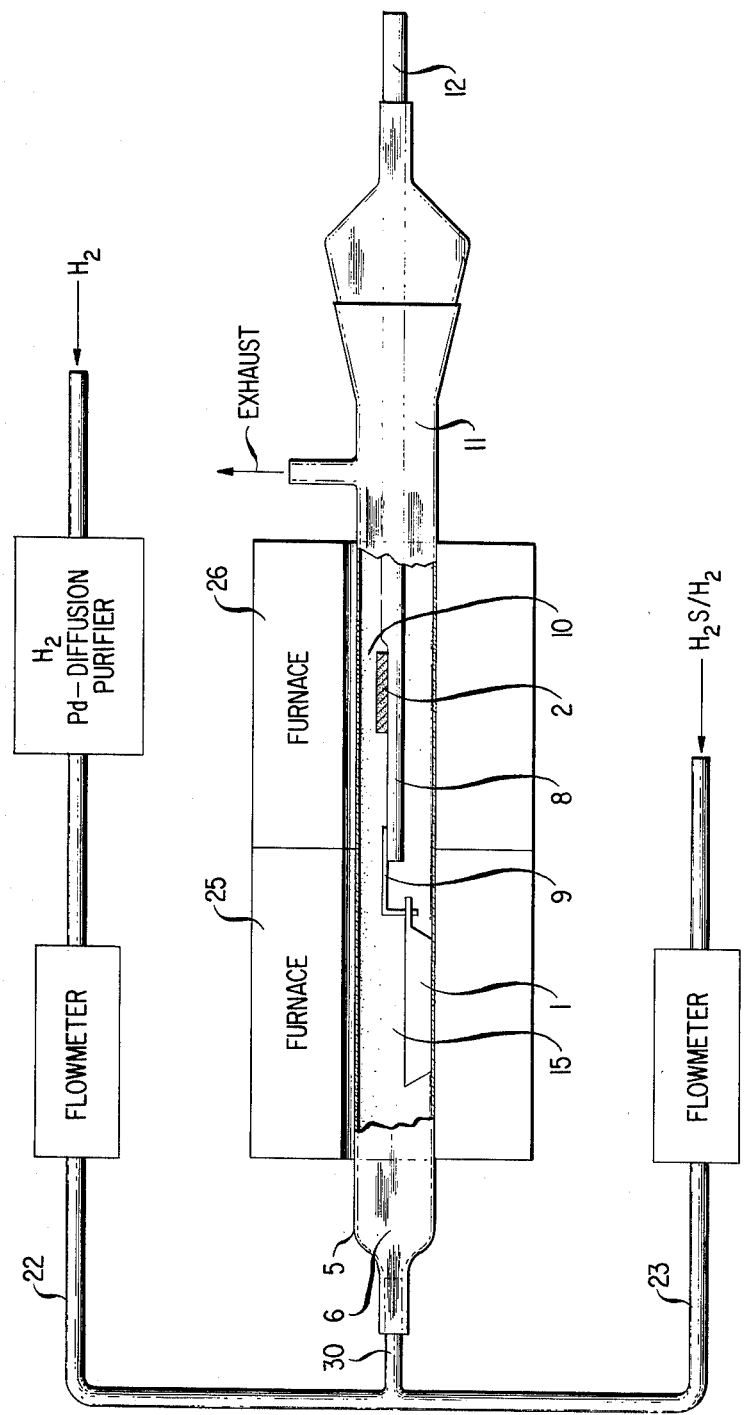
FIG. 1 is a schematic view of the apparatus used in the etching and deposition process of the invention.

The preferred embodiments of the invention can best be described by individually detailing the fabrication of p-InP/n-CdS heterodiodes and p-GaAs/n-CdS heterodiodes.

Fabrication of p-InP/n-CdS Cells

In an illustrative embodiment of the practice of the invention both polycrystalline and single crystal InP were employed. Single crystal p-InP (Cd or Zn dopants) were made by the liquid encapsulated Czochralski process. The single crystals were cut to expose the (111) crystal plane. This plane was then Syton polished. (Syton is an alkaline colloidal suspension of $SiO_2$ useful as a polishing agent.) The crystal was then immersed in boiling trichloroethylene to remove any oil or grease. The crystal was air dried and put in boiling propanol to remove substantially all traces of trichloroethylene. Following the propanol treatment the (111) face was etched for about 10 sec., with a 1% by volume solution of bromine in methanol. The crystal was again placed in boiling propanol to remove any traces of etchant and the crystal was then dried.

Polycrystalline p-type InP was grown on a conductive layer, by the CVD $H_2$/HCl process disclosed in now abandoned application of Bachmann et. al. Ser. No. 522,060 filed Nov. 8, 1974 Canadian Application No. 239,058 filed Nov. 5, 1975 and in co-pending application of Bachmann et. al. Ser. No. 672,878, filed Apr. 2, 1976. Briefly this CVD process comprises flowing palladium-diffused hydrogen through a bubbler containing phosphorus trichloride held at a temperature between 0° and 5° C. The flow rate of the $H_2$ and the bubbler temperature was adjusted to produce a mole fraction of $PCl_3$ in $H_2$ of between 1 and 5%. The $PCl_3$ saturated $H_2$ was then flowed over elemental In heated to about 740° C. The $H_2$ flow finally was passed over the conducting substrate for deposition. A minor fraction of Cd or Zn dopant was added to the main gas flow upstream from the substrate by heating either elemental Cd or Zn in a separate $H_2$ stream to about 450° and 500° C respectively. The substrate was heated to about 630° C. The conductive substrate for the polycrystalline InP layer used in the preferred embodiment was a graphite block having a thin coating layer of GaAs. The GaAs was coated onto the graphite block using an apparatus described by Tietjen and Amick in *J. Electrochem. Soc.*, 113, 724 (1968) (See FIG. 1 of that paper.) Zinc was used as a dopant. Unlike the process described by Tietjen and Amick no $H_2Se$ or $PH_3$ was introduced into the chamber. A 2% by volume mixture of $AsH_3$ in $H_2$ was used as the source off As. Gallium was introduced by flowing a 2% by volume mixture of HCl in $H_2$ over elemental gallium heated to about 775° C. The zinc dopant was introduced by passing pure $H_2$ over elemental zinc heated to about 400° C. As shown in the Tietjen paper the various gas flows were combined as indicated and passed over a carbon substrate. The substrate had been cleaned by rinsing in trichloroethane and methanol and then firing in a hydrogen atmosphere at 1000° C. A substrate temperature of about 730° C was used. GaAs layers with hole concentration in the useful range between $1 \times 10^{18}$ and $2 \times 10^{19} cm^{-3}$ were obtained. The GaAs was used to improve the electrical contact usually achieved between polycrystalline InP and graphite or other conductive substrates. (The advantageous use of a GaAs layer is an invention of a different inventive entity and will be the subject of another application.)

The apparatus which was used for the etching of the InP and deposition of the CdS layer is shown in FIG. 1. The typical use of this apparatus is as follows. The substrate holder 8 which is at the end of a quartz rod 12 and the CdS containing quartz boat 1 are removed from the quartz reaction tube 5. The p type InP substrate 2 (either single crystal or polycrystalline) is placed on the end of the quartz substrate holder 8. The boat 1 is filled with pure cadmium sulfide e.g., 99.9999% and attached to substrate holder 8 by a glass tie rod 9. The boat and substrate are then inserted in the quartz reaction tube 5 until the CdS boat is resting in area 10 of the reaction tube and the substrate is in area 11. The entire system is then purged with helium.

A hydrogen/hydrogen sulfide gas flow is then introduced in the reaction tube through glass tube 30. The mole fraction of hydrogen sulfide in hydrogen needed to etch the InP substrate depends on the substrate temperature and the CdS source temperature. There should be sufficient hydrogen sulfide present to initiate etching of the substrate. However, the hydrogen sulfide concentration should be limited to prevent formation of nonvolatile indium-sulfur compounds, such as $In_2S_3$. Generally, a hydrogen sulfide mole fraction between 1% and 6% satisfies these conditions and is preferred. Most advantageously a mole fraction between 2% and 3% can be used.

The mole fraction of hydrogen sulfide in the gas flow can conveniently be established by mixing in appropriate proportions a flow of palladium-diffused hydrogen added through tube 22, with a commercially available 14.6 mole percent mixture of $H_2S$ in pure hydrogen introduced through tube 23. (Certainly, other methods of producing the appropriate $H_2S$ concentration are available, but the described method has given quite adequate control.) The gas flow rate is not critical. Flow velocities above the substrate between 10 and 80 cm/min., preferably between 30 and 40 cm/min., have been used.

Once the desired gas flow rate and $H_2S$ concentration are established, the CdS boat is pushed into area 15 of the reaction tube and the substrate into area 10. This is accomplished by further inserting rod 12 into the system. The CdS is heated to between 600° and 880° C, preferably between 650° and 750° C., by furnace 25. The InP substrate 2 is heated by furnace 26 to between 500° C and 700° C. Preferably, the InP substrate is maintained between 550° and 650° C. For a CdS temperature of between 690° and 710° C, a substrate temperature of between 610° and 630° C is advantageous. Certainly for deposition the substrate must be at a lower temperature than the source of CdS. Typically, temperature differentials of 50° to 100° C are suitable.

The size of the substrate is not critical. Substrates of 1cm² are easily treatable. Typical substrates which have been processed have an area of 0.2 cm². On such substrates growth rates between 4 and 6 microns/hr. were easily obtainable. For single crystal or polycrystalline substrates the process can be continued until the desired CdS layer thickness is obtained.

However, use of very thin polycrystalline substrates presents the problem of etching through to the conductive base layer, e.g., the GaAs on graphite substrate. In this situation, the polycrystalline substrate is kept in the $H_2$/$H_2S$ gas flow for sufficiently short period of time to avoid the undesired result. After this shortened period the substrate of polycrystalline InP having a thin layer of CdS is removed from the apparatus. Then the thickness of the CdS layer is increased by conventional techniques, such as molecular beam epitaxy, (see Wagner, *Appl. Phys. Letts.* 122, 351 (1973) and *J. Appl. Phys.*, 45, 246 (1974)).

As described previously, the $H_2S$ begins etching the indium semiconductor compound used as a substrate and nucleation of CdS follows. The described process results in simultaneous etching and CdS deposition. This is desirable since an excellent heterodiode is obtained in one step. However, the process can be performed in a series of steps. For example, the link 9 between boat and substrate can be detached and the boat can be pushed to unheated area 6 of the reaction tube while the substrate is pushed into area 10. A $H_2$ flow with a small fraction of $H_2S$ is started and etches the substrate. Then the CdS is brought into area 15 by any suitable means and CdS deposition begins. Alternatively, the connected boat and substrate is inserted so that the former is in area 6 and the latter in area 15. An initial flow of 14.6 mole percent $H_2S$ in $H_2$ is introduced through tube 30. X-ray fluoresence analysis of an InP substrate indicates that a film of nonvolatile $In_2S_3$ is formed at this point. Then the $H_2S$ is removed from the gas flow and pure hydrogen is passed over the substrate. This results in formation of volatile In -sulfur compounds which produce etching. Then the boat with the CdS is retracted to area 15 shifting the substrate simultaneously to area 10. The cadmium sulfide is deposited on the clean substrate by transport in the pure hydrogen. The essential requirement in any sequence of steps is that before CdS is deposited on an area of the substrate, that area must be etched by the $H_2S$. Although the one-step process which was described is preferred the number of steps used to satisfy this essential requirement is not limited to single step processes.

Electrical contact to the heterodiodes made by the practice of the invention can be achieved by standard techniques. For example, a contact to single crystal InP was made by sequentially plating Au/Zn/Au onto the InP and then sintering at 475° C in forming gas. (See *J. Appl. Phys.*, 46 p. 4552 (1975). Contact to polycrystalline InP can be made by attaching a copper tab to its conducting substrate. Contact to the CdS layer deposited on either a single crystal of InP or a polycrystalline layer was made through a grid of In or liquid In-Ga eutectic alloy. When desired, an antireflection coating can be deposited on the CdS layer after attaching the electrical contacts, by evaporation of SiO.

Figure 2A:
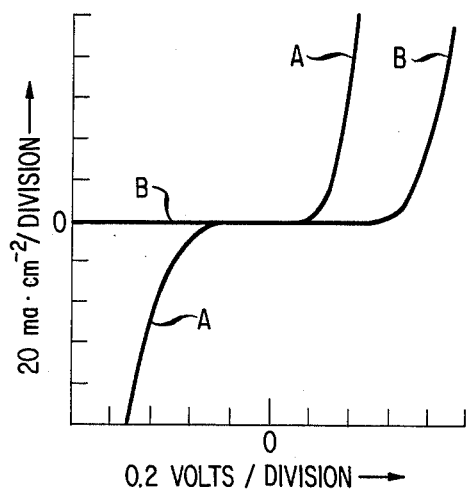
FIG. 2(a) shows a dark current-voltage plot measured for a single crystal p-InP/n-CdS solar cell made both with and without an H₂S etching step and FIG. 2(b) represents the current-voltage characteristics measured under air mass one (AM1) illumination of a p-InP/n-CdS cell without anti-reflection coating fabricated using an H₂S etching step.
Figure 2B:
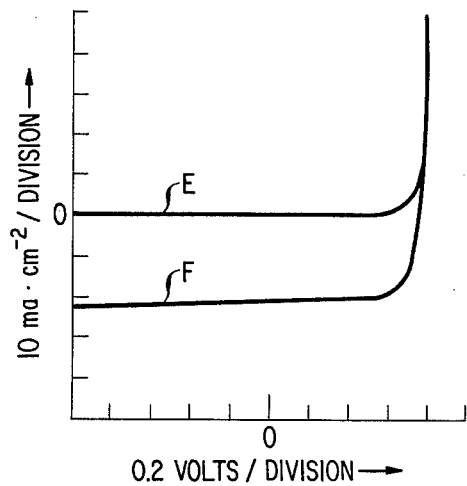

In FIG. 2, line A shows the dark current voltage characteristics of a diode with CdS deposited only in $H_2$, and line B shows a diode made with 2 mole percent of $H_2S$ added to the hydrogen. The breakdown voltage in the latter case is 5V reverse bias (not shown in the figure) indicating a reduction of the interface states which can be caused by impurities and contamination of the InP surfaces. The IvsV curve of the vapor etched cell without antireflection coating using air mass one (AM1) illumination simulated by a tungsten-halogen lamp and a Schott KG1 filter is shown as line F in FIG. 2(b) (See Moon, *J. Franklin Inst.* 230, 583 (1940) for definition of air mass conditions). Line E of FIG. 2(b) is the dark current tracing.

The power conversion efficiency of the single crystal cells with antireflection coating for air mass two (AM2) was determined from the IvsV data and from quantum efficiencies observed at each wavelength within AM2 conditions. Values of up to 13.5 percent were consistently obtained. A polycrystalline p-InP/n-CdS cell with a power conversion efficiency of about 4.6% at AM2 was fabricated.

Fabrication of pGaAs/n-CdS Cell

In a typical preparation a single crystal of p-type GaAs (obtainable from Laser Diode Laboratories) was cut and polished on the (111) face and cleaned as described for single crystals of InP.

The apparatus of FIG. 1 was again used. The typical use of this apparatus is as follows. The crystal is placed on the substrate holder 8. The boat 1 is filled with pure cadmium sulfide e.g., 99.9999 percent, the system is purged with helium, and a flow of $H_2S$ in $H_2$ is initiated. The boat and pedestal are pushed into the reaction zone so that the boat is in area 6 and the substrate in area 15. The etching time required depends on substrate temperature. For example, the substrate is allowed to etch for between 30 and 60 minutes at 650° C. It is then pulled into reaction area 10 while the boat is pulled into reaction area 15. The cadmium sulfide is allowed to deposit until a layer of desired thickness is obtained. (Generally, the cadmium sulfide layer formed at a rate of between 3 and 7 microns/hr.)

For GaAs the etching is performed before the deposition of CdS because the volatile sulfur compounds of gallium thus formed sublime at higher temperatures than the corresponding indium-sulfur compounds. Thus, a higher temperature of furnace 25 is necessary for the etching step performed with the substrate in area 15. Temperatures between 650° and 750° C., are suitable for this etching step. After the boat and substrate are moved into positions 15 and 10 respectively, the deposition is performed with the same conditions given for the InP embodiment. Other parameters, such as flow rate and $H_2S$ mole fraction, are the same as in the InP discussion. Since the temperature necessary to etch GaAs is higher than the temperature suitable for depositing a good CdS layer, and the etching rate is slower, the preferred embodiment involves a two-step process.

Figure 3:
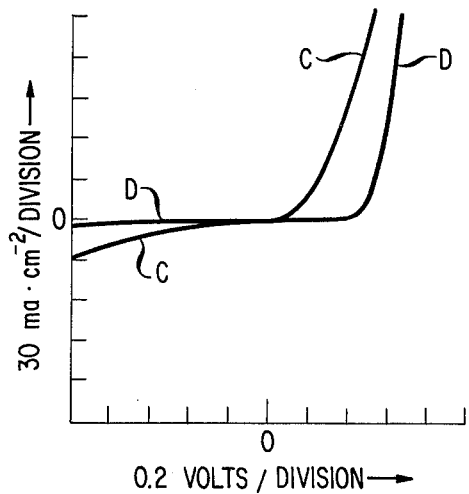
FIG. 3 shows current-voltage characteristics for a single crystal p-GaAs/n-CdS device produced both with and without an etching step.

Electrical contact is made to the GaAs by well-known techniques, such as Au/Zn/Au plating or spot welding Au-Zn wires, to the CdS as described in the case of p-InP/n-CdS cells. The solar power efficiency of a cell without antireflection coating under AM2 conditions was about 5 percent. Line C in FIG. 3 shows the measured dark current voltage characteristics for an heterostructure made by depositing n-CdS on p-GaAs through a $H_2$ transport technique without $H_2S$ etching. As can be seen this entity made without etching has an almost ohmic property. Line D represents the properties of the device made by the inventive process. Diode characteristics are shown.

What is claimed is:

1. A hydrogen gas transport process for depositing a n-type cadmium sulfide layer on a p-type semiconductor material comprising the steps of passing a stream of hydrogen gas over a heated substrate of said p-type semiconductor material wherein heated cadmium sulfide is placed in the flow of said hydrogen gas upstream from said heated substrate characterized in that a sufficient quantity of hydrogen sulfide gas above the quantity of $H_2S$ present from any reaction of said cadmium sulfide with said stream of hydrogen gas is introduced to etch said p-type semiconductor material which is chosen from the group consisting essentially of gallium arsenide and indium phosphide and depositing n-type CdS on the etched semiconductor material.

2. The process of claim 1 wherein said quantity of hydrogen sulfide gas is between 1 and 6 mole percent of said hydrogen gas.

3. The process of claim 1 wherein said heated cadmium sulfide is introduced into said $H_2$ gas after the introduction of said heated substrate and said hydrogen sulfide.

4. The process of claim 1 wherein said heated substrate is a single crystal.

5. The process of claim 1 wherein said heated substrate is polycrystalline.

6. The process of claim 5 including the step of removing the CdS coated substrate from said hydrogen gas flow and depositing additional cadmium sulfide to said n-type cadmium sulfide.

7. The process of claim 6 wherein said additional cadmium sulfide is deposited by molecular beam epitaxy.

8. A hydrogen gas transport process for depositing a n-type cadmium sulfide layer on a p-type semiconductor material selected from the group consisting essentially of gallium arsenide and indium phosphide comprising the steps of (1) passing a sufficient flow of $H_2S$ over said p-type semiconductor material at elevated temperature to form a layer of non-volatile sulfides of said p-type semiconductor material (2) flowing hydrogen over said layer of non-volatile sulfides at a given temperature to chemically reduce said layer of non-volatile sulfides to volatile sulfides of said p-type semiconductor material which are removed and (3) depositing a layer of CdS on said p-type semiconductor material etched by steps (1) and (2) by passing a gas stream containing CdS generating materials over said p-type semiconductor material.

9. A hydrogen gas transport process for depositing a n-type cadmium sulfide layer on a p-type semiconductor material comprising the steps of passing over a heated substrate of said p-type semiconductor material a stream of hydrogen gas including cadmium and a stoichiometric amount of sulfur-containing entities which can form CdS with said cadmium characterized in that sufficient quantity of hydrogen sulfide above that amount present from any reaction of said sulfur entities with said hydrogen gas is added to said stream of hydrogen gas to etch said p-type semiconductor material which is chosen from the group consisting essentially of gallium arsenide and indium phosphide and depositing n-type CdS on the etched semiconductor material.

10. The process of claim 9 wherein said quantity of hydrogen sulfide gas is between 1 and 6 mole percent of said stream of hydrogen gas.

* * * * *